US006981570B2

(12) United States Patent
Dalbec

(10) Patent No.: US 6,981,570 B2
(45) Date of Patent: Jan. 3, 2006

(54) LOUDSPEAKER SYSTEM WITH COMMON LOW AND HIGH FREQUENCY HORN MOUNTING

(76) Inventor: Richard H. Dalbec, 79 Stock La., Rensselaer, NY (US) 12144

(*) Notice: Subject to any disclaimer, the term of this patent is extended or adjusted under 35 U.S.C. 154(b) by 47 days.

(21) Appl. No.: 10/434,379

(22) Filed: May 8, 2003

(65) Prior Publication Data

US 2003/0209384 A1 Nov. 13, 2003

Related U.S. Application Data

(60) Provisional application No. 60/379,329, filed on May 9, 2002.

(51) Int. Cl.

| | |
|---|---|
| ***G10K 11/02*** | (2006.01) |
| ***H05K 5/02*** | (2006.01) |
| ***H04R 1/02*** | (2006.01) |
| ***H04R 1/24*** | (2006.01) |
| ***H04R 1/32*** | (2006.01) |

(52) U.S. Cl. ...................... 181/182; 181/179; 181/187; 181/152; 381/340; 381/342

(58) Field of Classification Search ................ 181/182, 181/179, 187, 188, 199, 152, 159, 160; 381/339, 381/340, 342, 345, 350, 343
See application file for complete search history.

(56) References Cited

U.S. PATENT DOCUMENTS

| | | | | | |
|---|---|---|---|---|---|
| 1,878,018 | A | * | 9/1932 | Stephens | 181/159 |
| 3,892,288 | A | * | 7/1975 | Klayman et al. | 181/156 |
| 4,100,371 | A | * | 7/1978 | Bayliff | 381/335 |
| 4,301,889 | A | * | 11/1981 | Tralonga | 181/156 |
| 4,314,620 | A | * | 2/1982 | Gollehon | 181/152 |
| 4,569,076 | A | * | 2/1986 | Holman | 181/151 |
| 4,635,748 | A | * | 1/1987 | Paulson | 181/152 |
| 4,885,782 | A | * | 12/1989 | Eberbach | 381/300 |
| 5,046,581 | A | * | 9/1991 | Mitchell | 181/152 |
| 5,109,423 | A | * | 4/1992 | Jacobson et al. | 381/340 |
| 5,526,456 | A | * | 6/1996 | Heinz | 181/152 |
| 5,647,012 | A | * | 7/1997 | Han | 181/156 |
| 5,875,255 | A | * | 2/1999 | Campbell | 181/199 |
| 6,028,947 | A | * | 2/2000 | Faraone et al. | 181/152 |
| 6,081,602 | A | * | 6/2000 | Meyer et al. | 381/99 |
| 6,118,883 | A | * | 9/2000 | Rocha | 181/152 |
| 6,393,131 | B1 | * | 5/2002 | Rexroat | 381/342 |

FOREIGN PATENT DOCUMENTS

| | | | | |
|---|---|---|---|---|
| GB | 2226214 | A | * | 6/1990 |
| JP | 58031694 | A | * | 2/1983 |
| JP | 01135295 | A | * | 5/1989 |
| JP | 03022796 | A | * | 1/1991 |
| JP | 06105385 | A | * | 4/1994 |
| JP | 11234782 | A | * | 8/1999 |

* cited by examiner

*Primary Examiner*—Edgardo San Martin
(74) *Attorney, Agent, or Firm*—Schmeiser, Olsen & Watts

(57) ABSTRACT

The invention relates generally to the field of audio loudspeaker enclosures, and more particularly to a method of mounting the internal components in the loudspeaker so as to control the loudspeaker output. Specifically a mounting structure and method for mounting the loudspeaker horn to its associated compression driver are disclosed. The mounting structure allows the directivity of the loudspeaker output, and the frequency/phase control of the loudspeaker, output to be controlled by the spatial arrangement of these components in the loudspeaker enclosure.

20 Claims, 7 Drawing Sheets

LOUDSPEAKER SYSTEM WITH COMMON LOW AND HIGH FREQUENCY HORN MOUNTING

This application claims the benefit of U.S. Provisional Application No. 60/379,329 filed May 9, 2002.

BACKGROUND OF THE INVENTION

1. Technical Field

The invention relates generally to a method of mounting internal components in a loudspeaker to control the loudspeaker output. Specifically, a mounting structure and method for mounting the loudspeaker horn to its associated compression driver is disclosed, where the horn and the compression driver are mounted on the same interior baffle within the loudspeaker enclosure.

2. Related Art

A long-standing problem in the design of audio loudspeakers relates to the loudspeaker enclosure and the manner and location of mounting components within the enclosure. Known loudspeaker enclosures typically include one or more low frequency subassemblies and a single high frequency speaker subassembly. Multiple numbers of these loudspeaker enclosures (i.e., typically four or more), in combination, are required to produce an acoustic effect which has limited acoustical interference, especially between outputs of the low frequency subassemblies and the high frequency speaker subassemblies. Conventional loudspeaker constructions also typically produce an unbalanced power response at near- to mid-field distances from the loudspeaker enclosure. Further, the spatial separation between the one or more low frequency subassemblies and the single high frequency speaker subassembly, within a particular enclosure, that is required to produce a desired level of acoustic quality, necessitates a relatively large-sized loudspeaker enclosure. This loudspeaker enclosure may not be physically suitable for particular locations, so that a reduced loudspeaker enclosure with attendant reduced acoustical qualities may be the resulting but unacceptable compromise.

Thus, a need exists for a loudspeaker structure and component mounting method which produces a loudspeaker enclosure yielding the acoustic qualities of a combination of loudspeaker enclosures larger in a single, smaller enclosure. A further need exists for a loudspeaker enclosure which accomplishes a given acoustic criteria with a smaller number of components, in the smaller enclosure.

SUMMARY OF THE INVENTION

To overcome the above deficiencies, the present invention provides a structure and related method of producing a loudspeaker enclosure which a loudspeaker structure and component mounting method which produces a loudspeaker enclosure yielding the acoustic qualities of a larger enclosure in a relatively smaller enclosure. The present invention also accomplishes this loudspeaker with a smaller number of components.

In a first general aspect, the present invention provides an audio loudspeaker assembly comprising: an enclosure; an inner baffle structure mounted inside said enclosure and operatively attached to said enclosure; at least one low frequency subassembly operatively mounted on said baffle structure, said low frequency subassembly having a low frequency horn; and a high frequency subassembly operatively mounted on said baffle structure, said high frequency subassembly having a high frequency horn.

In a second general aspect, the present invention provides a method of constructing an audio loudspeaker, said method comprising: providing an enclosure; providing an inner baffle structure mounted inside said enclosure and operatively attached to said enclosure; providing at least one low frequency subassembly operatively mounted on said baffle structure, said low frequency subassembly having a low frequency horn front end; and providing a high frequency subassembly operatively mounted on said baffle structure, said high frequency subassembly having a high frequency horn front end.

In a third general aspect, the present invention provides an audio loudspeaker system comprising: a primary control system for controlling the directivity of the loudspeaker system, said primary control system responsive to a broadband directivity characteristic factor, said directivity factor representative of the directional capability of the audio output of the loudspeaker system; and wherein said directivity factor is directly proportional to the frequency of operation across the audible frequency range, producing a linear directivity characteristic.

In a fourth general aspect, the present invention provides a method of controlling directivity in a loudspeaker system, said method comprising: providing a loudspeaker enclosure, said loudspeaker enclosure including a high frequency horn and at least one low frequency horn; mounting said high frequency horn and said low frequency horn on the same baffle with said loudspeaker enclosure; and providing a primary control system for controlling the directivity of the loudspeaker system, said primary control system operationally coupled to said low frequency horn and said high frequency horn.

In a fifth general aspect, the present invention provides an acoustic performance system comprising: an venue area designated for an acoustic performance; one or more loudspeaker enclosures distributed in said venue area, said loudspeaker enclosures adapted to provide amplification and distribution of said acoustic performance; at least one of said loudspeaker enclosures further comprising; a baffle structure mounted inside said enclosure and operatively attached to said outer enclosure; at least one low frequency subassembly operatively mounted on said baffle structure, said low frequency subassembly having a low frequency horn front end; and a high frequency subassembly operatively mounted on said baffle structure, said high frequency subassembly having a high frequency horn front end.

The foregoing and other features and advantages of the invention will be apparent from the following more particular description of embodiments of the invention. It is to be understood that both the foregoing general description and the following detailed description are exemplary, but are not restrictive, of the invention.

BRIEF DESCRIPTION OF THE DRAWINGS

The features of the present invention will best be understood from a detailed description of the invention and an embodiment thereof selected for the purposes of illustration and shown in the accompanying drawings in which.

DETAILED DESCRIPTION OF THE INVENTION

Figure 1:
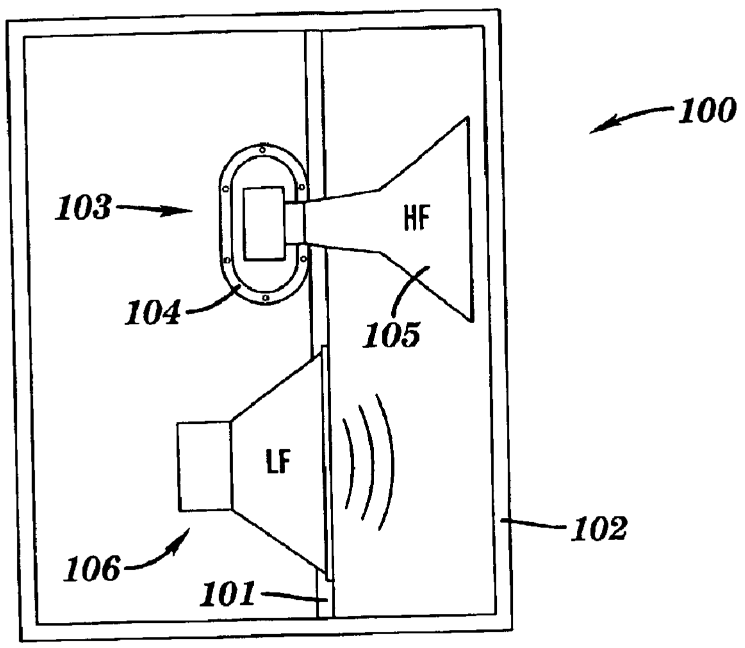
FIG. 1 is a schematic drawing of a loudspeaker enclosure according to the present invention.

Although certain embodiments of the present invention will be shown and described in detail, it should be understood that various changes and modifications may be made without departing from the scope of the appended claims. The scope of the present invention will in no way be limited to the number of constituting components, the materials thereof, the shapes thereof, the relative arrangement thereof, etc., and are disclosed simply as an example of an embodiment. The features and advantages of the present invention are illustrated in detail in the accompanying drawings, wherein like reference numerals refer to like elements throughout the drawings.

The invention described herein provides a loudspeaker enclosure wherein a high frequency subassembly and one or more low frequency assemblies are mounted on a common component, which is typically a baffle structure located inside the overall loudspeaker outer enclosure. Referring to FIG. 1, this arrangement is shown in the schematic drawing. A loudspeaker system 100 includes an outer enclosure 102, having front and back walls, and sidewalls. Inside the outer enclosure, an inner baffle structure 101 is mounted. The inner baffle structure 101 is securely attached to said outer enclosure 102. A representative low frequency subassembly 106 is mounted on the rear side of the baffle structure 101 via its low frequency horn. A high frequency subassembly 103 is mounted on baffle structure 101 so that the motor portion 104 of the high frequency subassembly 103 is situated to the rear of baffle structure 101, while the horn 105 is located to the front of the baffle structure 101.

Figure 2:
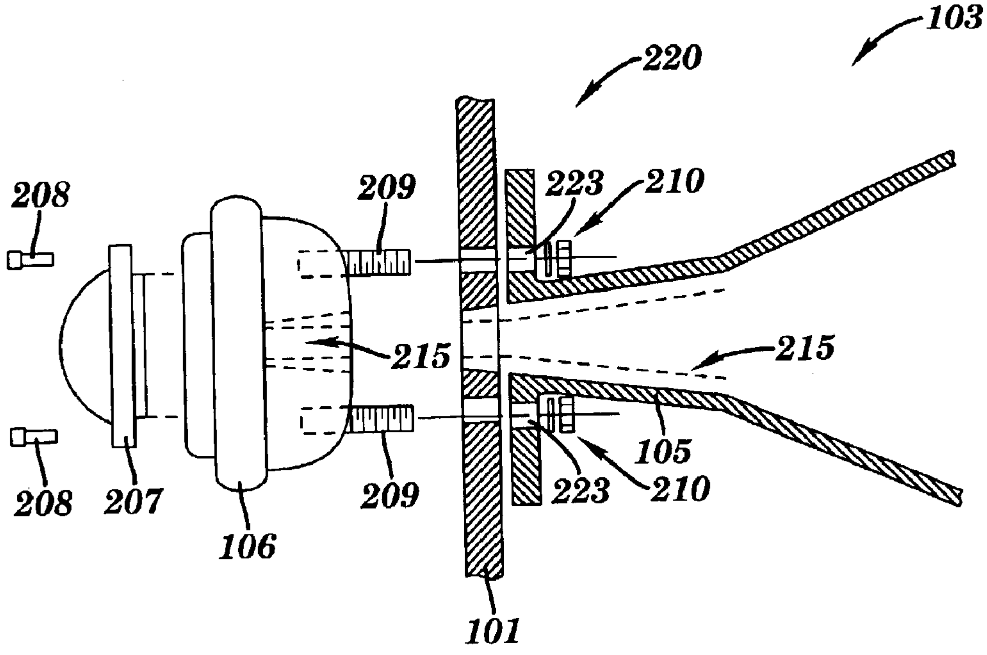
FIG. 2 is a schematic drawing of a high frequency subassembly according to the present invention.

FIG. 2 shows a more detailed schematic drawing of high frequency subassembly 103 from the front perspective. Baffle structure 101 supports, on one side, driver motor 106. Mounted on driver motor 106 is the motor diaphragm 207, which is attached by screws 208 or other suitable fastening means. Horn 105 is mounted to the baffle structure 101 from the other side of the baffle structure 101. Horn mounting flange 220 includes through holes 223 which align with mounting screws 209 of the driver motor 106. This alignment is facilitated when the horn mounting flange 220 is rotatably mounted to said baffle structure 101. An embodiment of the horn 105 has a lower cutoff frequency of approximately 700 Hz. Mounting screws 209 are received by machine nuts 210 to securely attach the driver motor 106 to the horn 105, and the high frequency subassembly 103 to the baffle structure 101. Proper alignment of the driver motor 106 to the horn 105 also ensures proper alignment of the portions of the waveguide 215 which are located in the driver motor 106 and the starting throat area of horn 105. Proper alignment occurs when the central, longitudinal axes of the horn and of the waveguide coincide.

Figure 3:
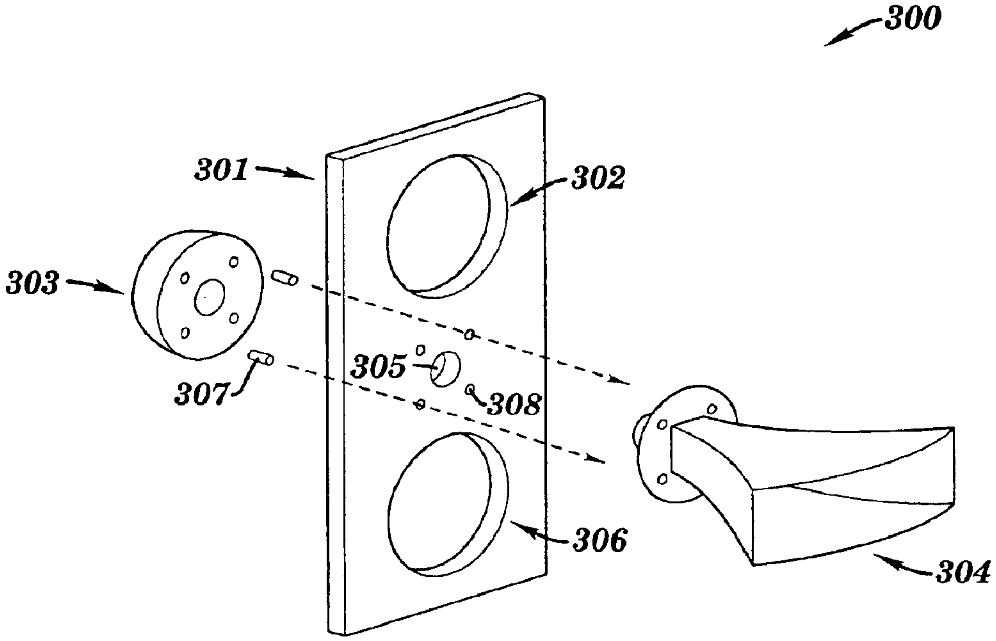
FIG. 3 is an exploded view of a partial loudspeaker assembly according to the present invention.
Figure 4:
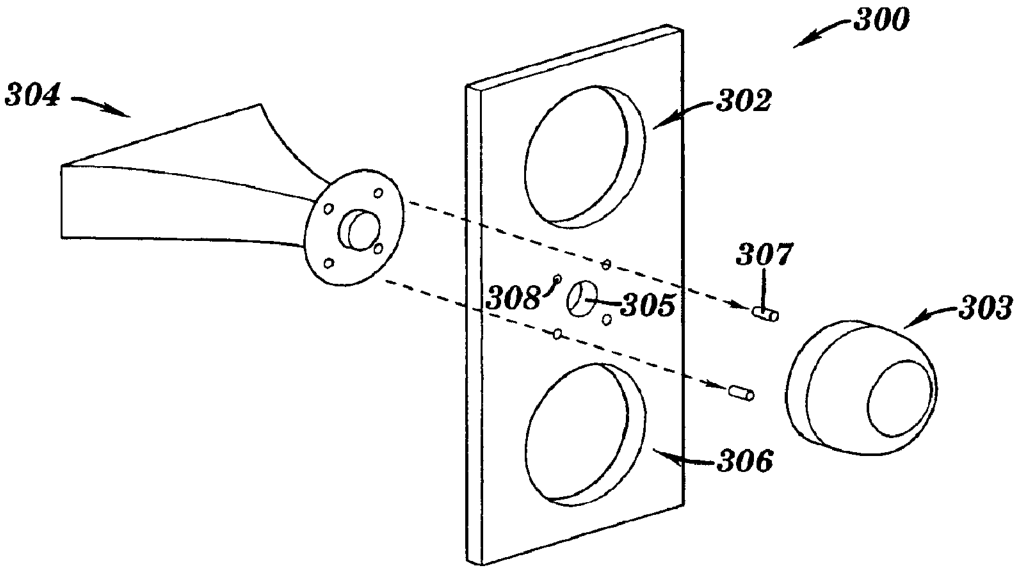
FIG. 4 is a is another view of the partial loudspeaker assembly of FIG. 3.

FIG. 3 illustrates an exploded view of a partial loudspeaker assembly 300 viewed from the front of the assembly. Baffle structure 301 includes two openings 302, 306 intended to receive low frequency subassemblies (not shown). Through hole 305 is intended to receive both horn 304 and driver motor 303 which are aligned and secured about through hole 305 with fasteners 307 or the like. FIG. 4 presents another view of the partial loudspeaker assembly of FIG. 3, from the rear perspective.

Figure 5:
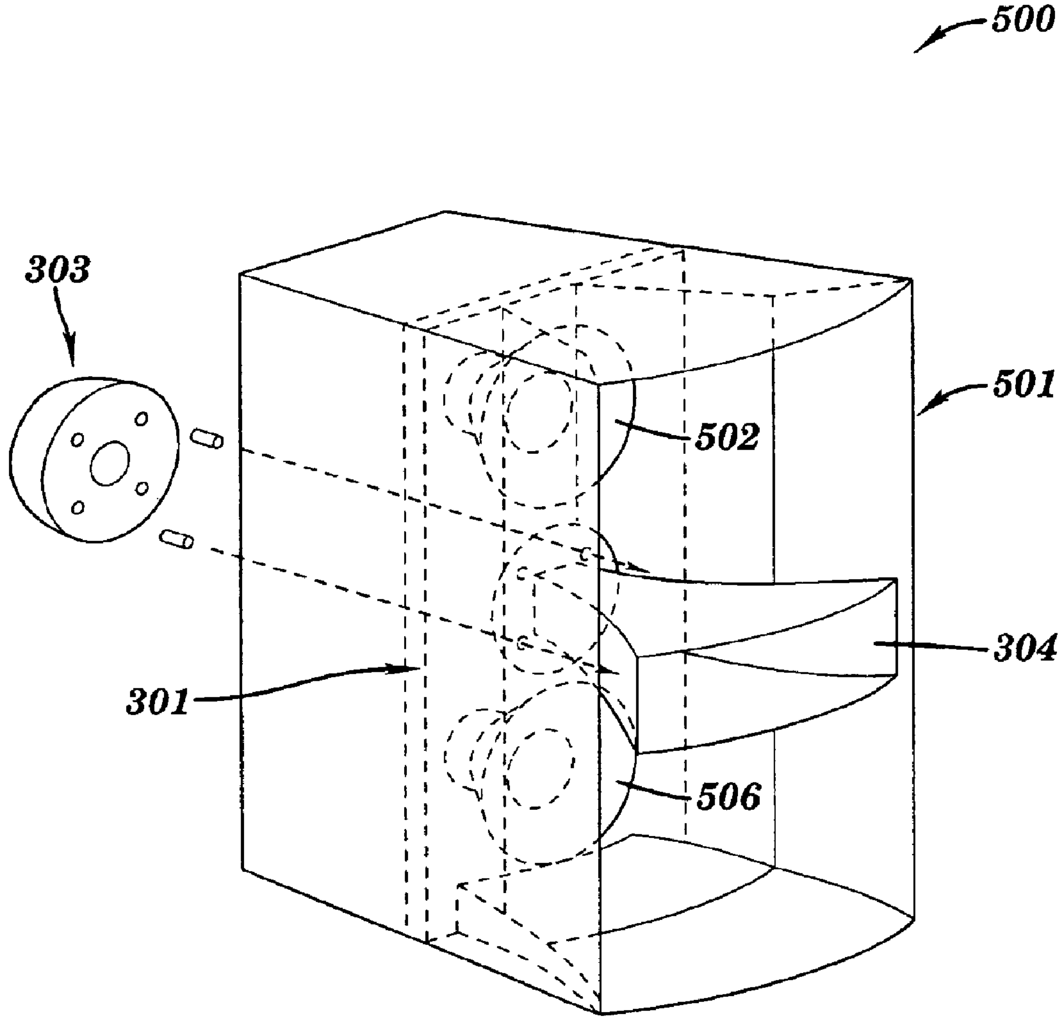
FIG. 5 is a partially exploded view of a loudspeaker enclosure according to the present invention.

FIG. 5 is a partially exploded view of an acoustic system 500 including loudspeaker enclosure 501 according to one embodiment of the present invention. The spatial relationship of the low frequency subassemblies 502, 506 to the high frequency subassembly comprising a driver motor 303 and a horn 304, when these components are mounted on a baffle structure 301.

Figure 6:
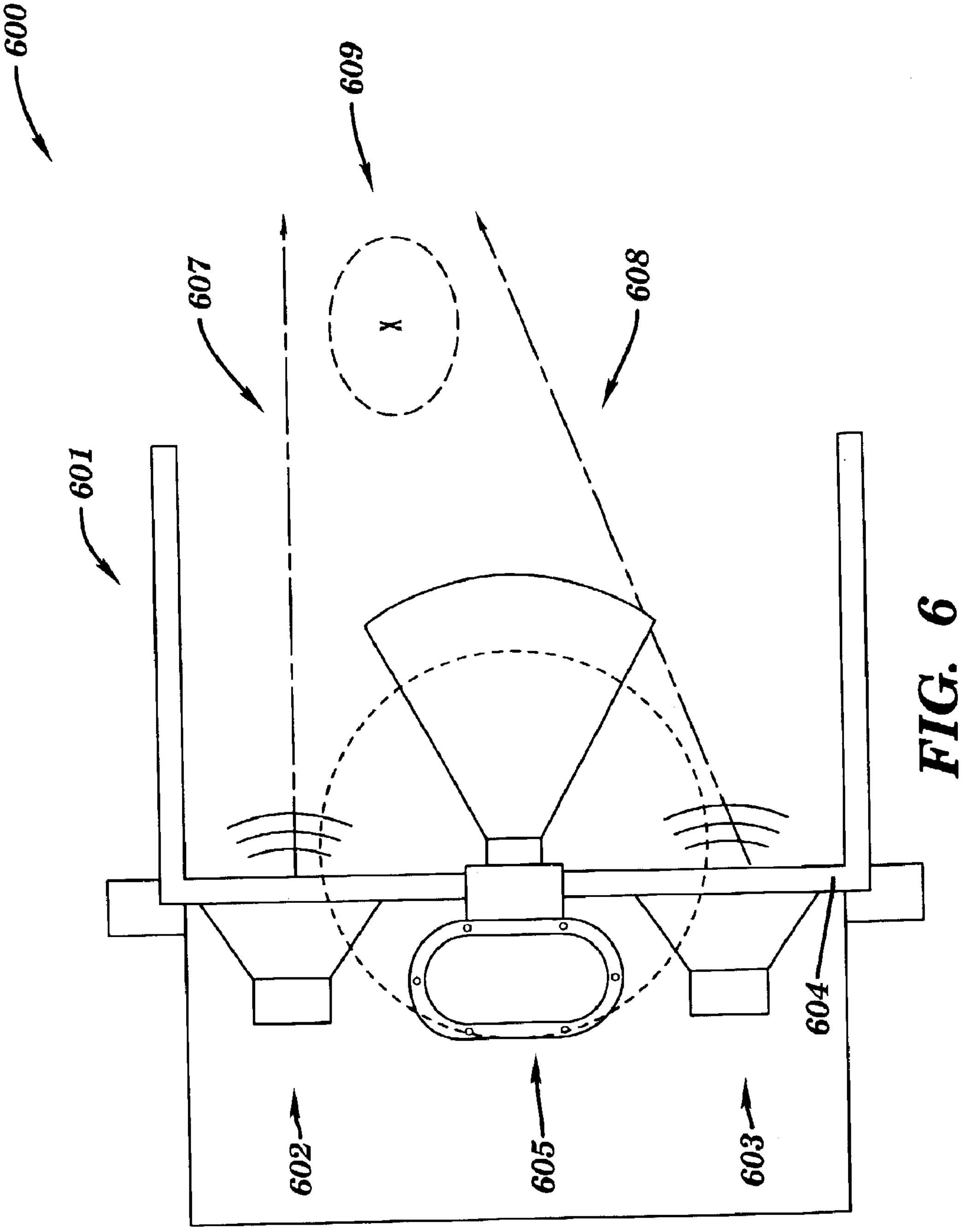
FIG. 6 is a schematic drawing of a loudspeaker and its associated destructive interference pattern according to the present invention.

FIG. 6 is a schematic drawing of a loudspeaker assembly 600 according to an embodiment of the present invention, and its associated destructive interference pattern 609. Loudspeaker 601 includes a baffle structure 604, to which are mounted low frequency subassemblies 602, 603 and high frequency subassembly 605. The beam pattern 609 indicates reduced off-axis destructive interference centered about location X, and caused by the locations of low frequency wave patterns following a first axis 607 and a second axis 608, relative to a central high frequency assembly 605.

Figure 7:
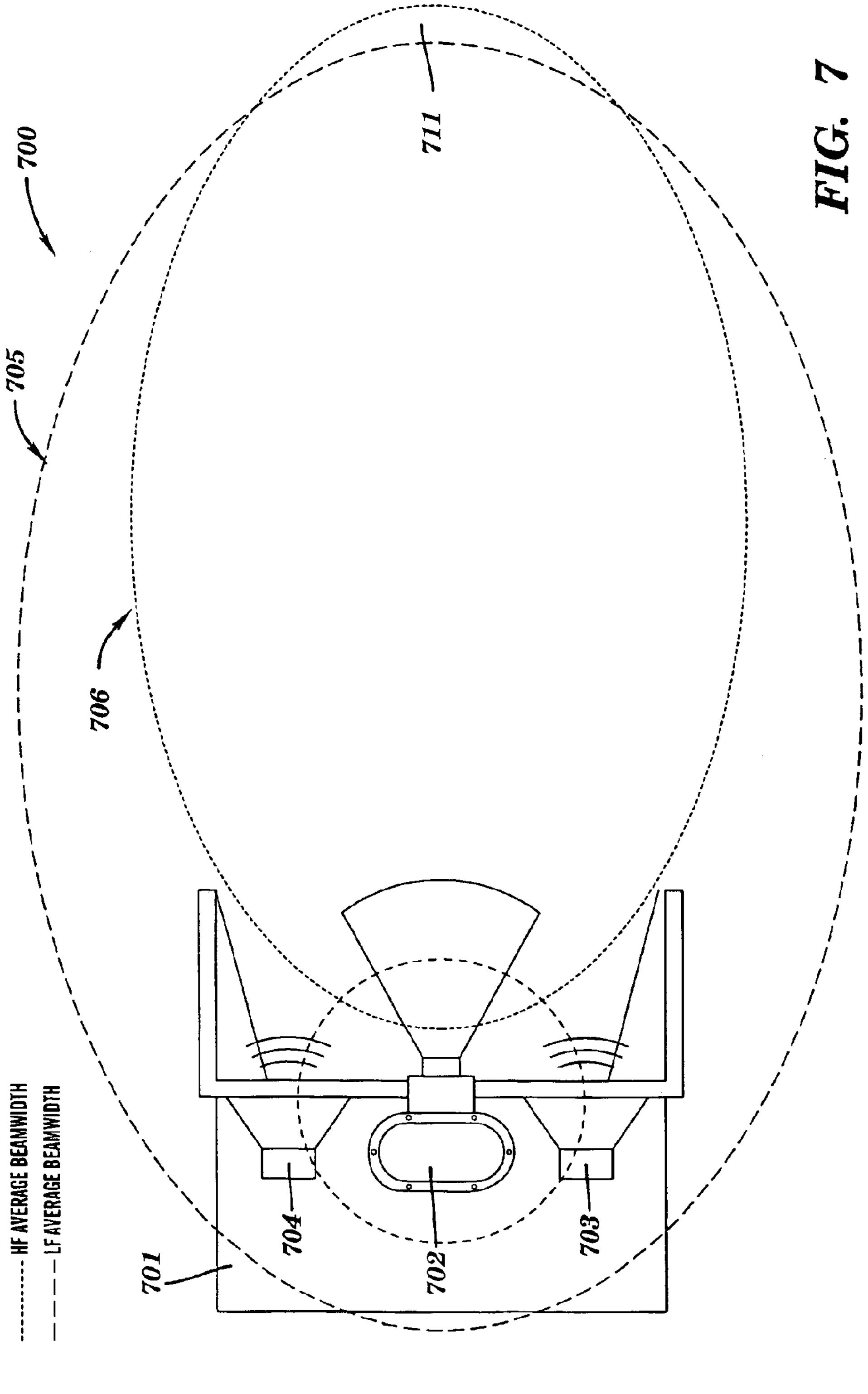
FIG. 7 is a schematic drawing of a loudspeaker and its associated power response according to the present invention.

FIG. 7 is a schematic drawing of a loudspeaker and its associated power response according to an embodiment of the present invention. The loudspeaker assembly 701 produces a balanced power response at near to mid-field distances from the loudspeaker enclosure. This property is depicted in FIG. 7, where an acoustic system 700 includes the loudspeaker assembly 701, a high frequency subassembly 702, two low frequency subassemblies 703, 704, and the associated low frequency 705 and high frequency 706 beam patterns produced by the respective low and high frequency subassemblies 703, 704, 702, respectively. Note that the ellipses formed by the low frequency 705 and high frequency 706 beam patterns have large portions where they basically coincide. Portion 711 represents the high frequency excess portion of the high frequency beam 706 portion.

Figure 8:
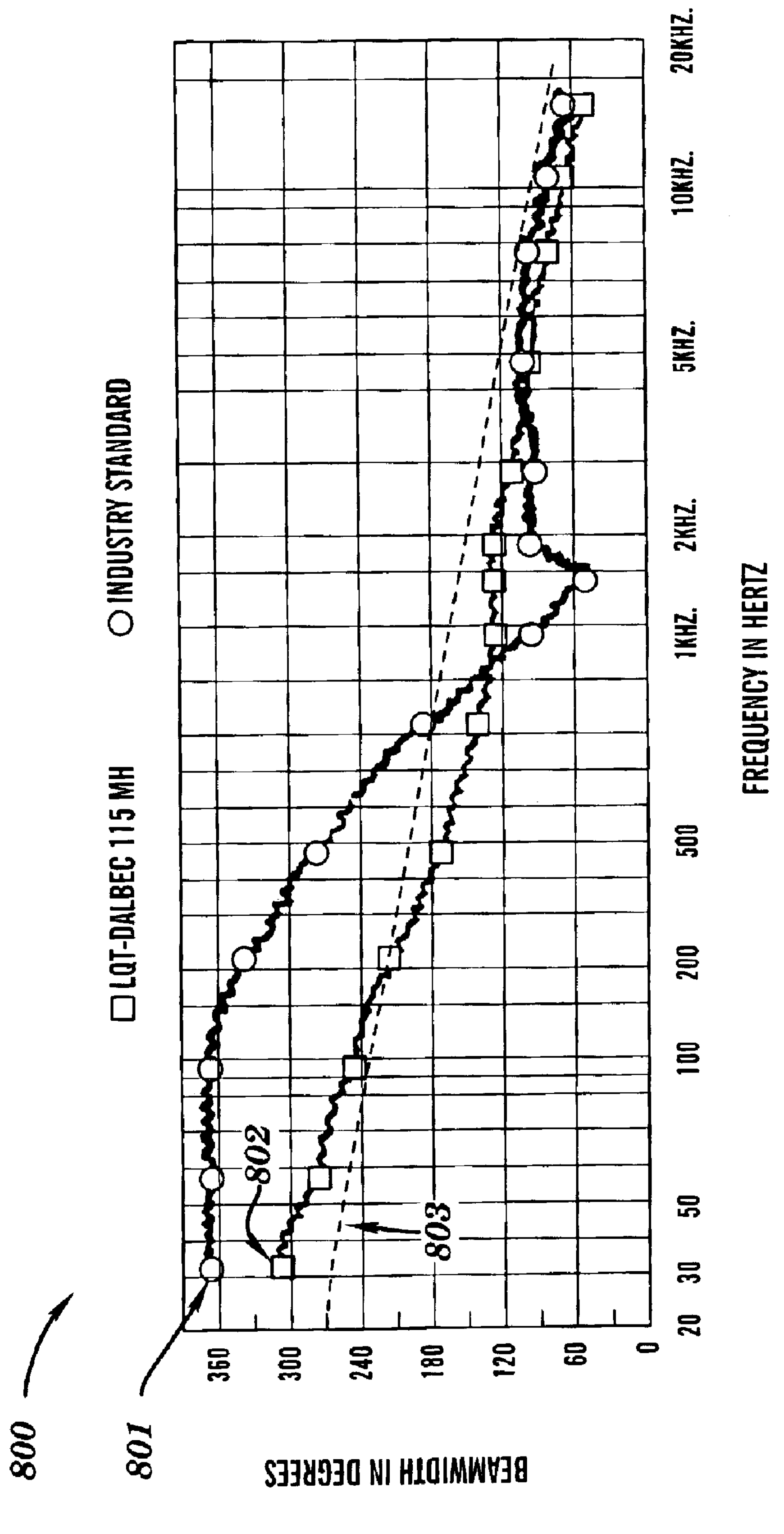
FIG. 8 is a graphical representation of the comparison of different directivity characteristics.

FIG. 8 is a graphical representation of the comparison of different directivity characteristics of the industry standard, an ideal characteristic, and a characteristic produced by an embodiment of the present invention. This embodiment of the present invention comprises two equivalent compact 15 inch two-way mid-high frequency loudspeakers having a 2 KHz crossover point, supplemented by a 18 inch subwoofer loudspeaker. Graph 800 shows the ideal characteristic as trace 803. Trace 801 represents the industry standard. Trace 802 represents the directivity characteristic obtained from the embodiment of the invention.

Figure 9:
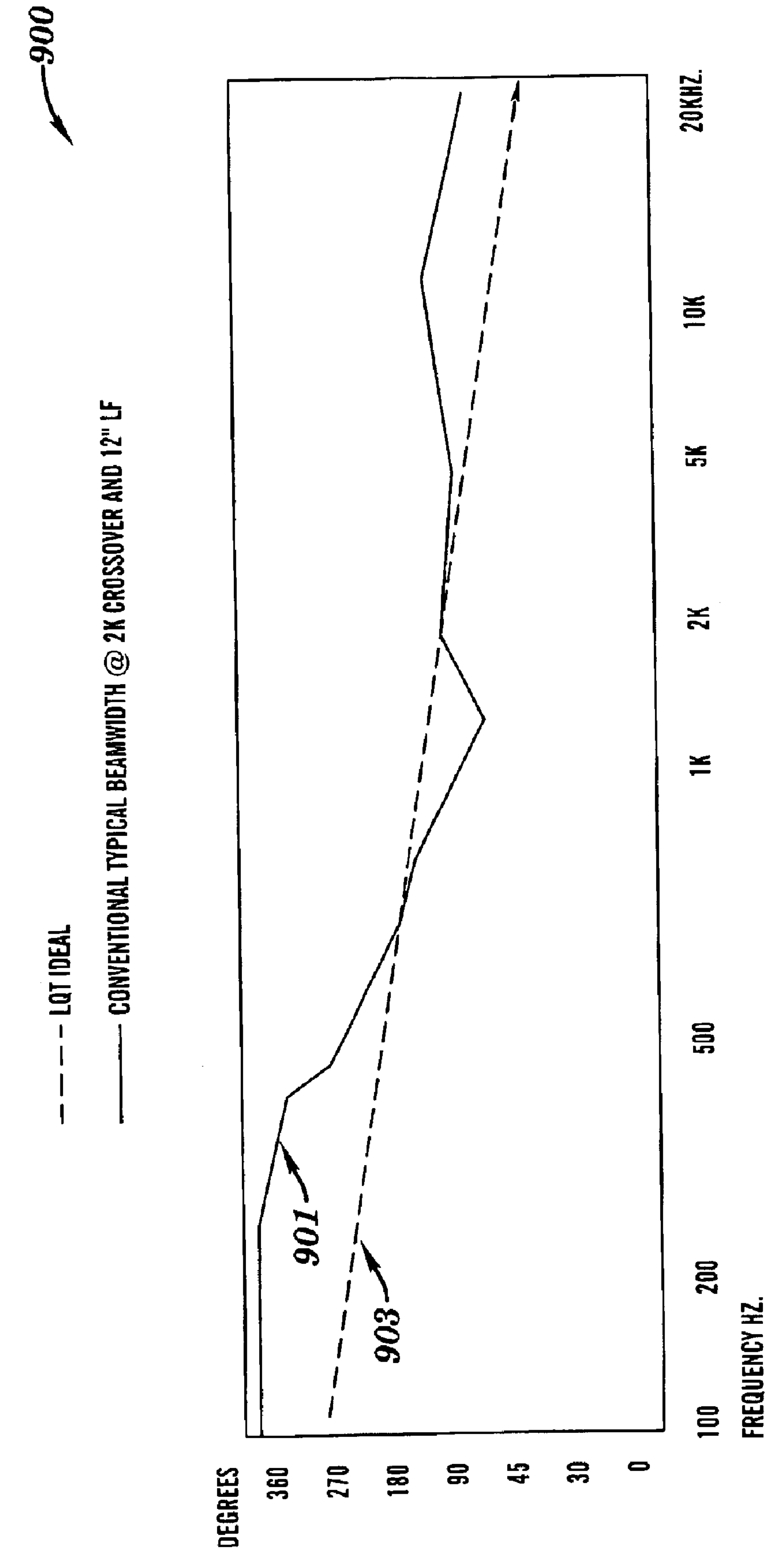
FIG. 9 is a graphical representation of the comparison of different beamwidth characteristics.

FIG. 9 is a graphical representation of the comparison of different beam width characteristics of an embodiment of the present invention compared to the related art. Graph 900 shows the ideal characteristic as trace 903. Trace 901 represents the related art.

The foregoing description of the present invention has been presented for purposes of illustration and description. It is not intended to be exhaustive or to limit the invention to the precise form disclosed or to the materials in which the form may be embodied, and many modifications and variations are possible in light of the above teaching. Such modifications and variations that may be apparent to a person skilled in the art are intended to be included within the scope of this invention as defined by the accompanying claims.

What is claimed is:

1. An audio loudspeaker assembly comprising:

an enclosure;

an inner baffle structure mounted inside said enclosure and operatively attached to said enclosure;

at least one low frequency subassembly operatively mounted on said baffle structure, said low frequency subassembly having a low frequency horn; and a high frequency subassembly operatively mounted on said baffle structure, said high frequency subassembly comprising a high frequency horn mounted in front of said baffle and a driver motor mounted to a rear side of said baffle.

2. The audio loudspeaker assembly of claim 1, wherein said at least one low frequency subassembly is operatively mounted on said baffle structure via a forward flange of said low frequency horn front end, such that said low frequency subassembly is substantially located to a rear of said baffle structure.

3. The audio loudspeaker assembly of claim 1, said high frequency subassembly comprising a motor diaphragm.

4. The audio loudspeaker assembly of claim 1, wherein said high frequency subassembly comprises a waveguide, said waveguide having a central longitudinal axis, wherein said waveguide and said high frequency horn have the same central longitudinal axis, and wherein said central longitudinal axis is substantially orthogonal to a plane incident with said baffle.

5. The audio loudspeaker assembly of claim 1, wherein said high frequency horn of said high frequency subassembly comprises a starting throat portion, said starting throat portion operationally attached to said driver motor of said high frequency horn, and wherein a portion of said baffle structure is sandwiched between said starting throat portion of said high frequency horn and said driver motor.

6. The audio loudspeaker assembly of claim 1, wherein said high frequency horn of said high frequency subassembly comprises a starting throat portion, said starting throat portion formed as an integral part of said baffle structure.

7. The audio loudspeaker assembly of claim 4, wherein said waveguide is rotatably mounted to said baffle structure.

8. The audio loudspeaker assembly of claim 1, wherein said high frequency horn is characterized by a lower cutoff frequency of approximately 700 Hz.

9. The audio loudspeaker assembly of claim 1, wherein said low frequency horn has a characteristic acoustic center, and said high frequency horn is located approximately at said acoustic center.

10. The audio loudspeaker assembly of claim 1, wherein said baffle structure comprises a through hole adapted to receive said high frequency horn, and said high frequency horn further comprises:

mounting means to receive said high frequency motor assembly; and a fastening device to mount said high frequency subassembly to operatively attach said high frequency horn, said baffle structure, and said high frequency motor assembly.

11. A method of constructing an audio loudspeaker, said method comprising:

providing an enclosure;

providing an inner baffle structure mounted inside said enclosure and operatively attached to said enclosure;

providing at least one low frequency subassembly operatively mounted on said baffle structure, said low frequency subassembly having a low frequency horn front end;

providing a high frequency subassembly operatively mounted on said baffle structure, said high frequency subassembly having a high frequency horn front end and a driver motor;

mounting in front of said baffle the high frequency horn front end and mounting said driver motor to a rear side of said baffle.

12. The method of claim 11, wherein said method further comprises the step of:

operatively mounting said at least one low frequency subassembly on said baffle structure via a forward flange of said low frequency horn front end, such that said low frequency subassembly is substantially located to a rear of said baffle structure.

13. The method of claim 11, wherein said high frequency subassembly comprises a motor diaphragm, and wherein said method further comprises the step of:

operatively mounting said motor diaphram to said high frequency subassembly.

14. The method of claim 11, wherein said step of providing an inner baffle structure mounted inside said enclosure further includes:

providing within said high frequency horn front end, a waveguide, said waveguide having a central longitudinal axis, wherein said waveguide and said horn have the same central longitudinal axis, and wherein said central longitudinal axis is substantially orthogonal to a plane incident with said baffle.

15. The method of claim 11, wherein said step of providing a high frequency subassembly operatively mounted on said baffle structure further comprises the step of:

providing said high frequency horn front end of said high frequency subassembly with a starting throat portion;

operationally attaching said starting throat portion to said motor of said high frequency horn front end; and positioning said starting throat portion of said high frequency horn front end and said motor so that a portion of said baffle structure is sandwiched between said starting throat portion of said high frequency horn front end and said motor.

16. The method of claim 11, wherein said step of providing a high frequency subassembly operatively mounted on said baffle structure further comprises the step of:

providing said high frequency horn front end of said high frequency subassembly with a starting throat portion;

forming an integral part of said baffle structure so that said integral part is adapted to receive said starting throat portion of said high frequency horn front end.

17. The method of claim 11, wherein said step of providing an inner baffle structure includes:

providing an inner baffle structure comprising a through hole adapted to receive said high frequency horn front end, said high frequency horn front end further comprising:

mounting means to receive said high frequency motor assembly; and a fastening device to mount said high frequency subassembly to operatively attach said high frequency horn, said baffle structure, and said high frequency motor assembly.

18. The method of claim 11, wherein said step of providing a high frequency subassembly includes providing a high frequency horn characterized by a lower cutoff frequency of approximately 700 Hz.

19. An acoustic performance system comprising:

a venue area designated for an acoustic performance;

one or more loudspeaker enclosures distributed in said venue area, said loudspeaker enclosures adapted to provide amplification and distribution of said acoustic performance;

at least one of said loudspeaker enclosures further comprising;

a baffle structure mounted inside said enclosure and operatively attached to said outer enclosure;

at least one low frequency subassembly operatively mounted on said baffle structure, said low frequency subassembly having a low frequency horn front end; and a high frequency subassembly operatively mounted on said baffle structure, said high frequency subassembly comprising a high frequency horn mounted in front of said baffle and a driver motor mounted to a rear side of said baffle.

20. The acoustic performance system of claim 19, further comprising:

at least one coherent loudspeaker array, said coherent array comprising at least two of said loudspeaker enclosures in operational combination.

* * * * *

UNITED STATES PATENT AND TRADEMARK OFFICE

CERTIFICATE OF CORRECTION

PATENT NO. : 6,981,570 B2
DATED : January 3, 2006
INVENTOR(S) : Dalbec

It is certified that error appears in the above-identified patent and that said Letters Patent is hereby corrected as shown below:

Column 7,
Line 10, delete "outer".

Signed and Sealed this

Eighteenth Day of April, 2006

JON W. DUDAS
*Director of the United States Patent and Trademark Office*